United States Patent
Lin et al.

(10) Patent No.: US 9,110,141 B2
(45) Date of Patent: *Aug. 18, 2015

(54) FLIP-FLOP CIRCUIT HAVING A REDUCED HOLD TIME REQUIREMENT FOR A SCAN INPUT

(71) Applicant: NVIDIA Corporation, Santa Clara, CA (US)

(72) Inventors: Hwong-Kwo Lin, Palo Alto, CA (US); Ge Yang, Dublin, CA (US); Xi Zhang, San Jose, CA (US); Jiani Yu, Fremont, CA (US); Ting-Hsiang Chu, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 244 days.

This patent is subject to a terminal disclaimer.

(21) Appl. No.: 13/668,143

(22) Filed: Nov. 2, 2012

(65) Prior Publication Data

US 2014/0129887 A1    May 8, 2014

(51) Int. Cl.
*G01R 31/28* (2006.01)
*G01R 31/3185* (2006.01)

(52) U.S. Cl.
CPC  *G01R 31/318541* (2013.01); *G01R 31/318536* (2013.01); *G01R 31/318594* (2013.01); *G01R 31/318544* (2013.01); *G01R 31/318555* (2013.01)

(58) Field of Classification Search
CPC ............ G06F 11/22571; G06F 11/079; G06F 11/0709; G06F 11/0793; G01R 31/318525; G01R 31/318536; G01R 31/318541; G01R 31/318594; G01R 31/318552; G01R 31/318555; G01R 31/318575; G11C 2029/3202; H03K 3/35625
USPC ............ 714/726, 729, 738, 724, 731; 326/16
See application file for complete search history.

(56) References Cited

U.S. PATENT DOCUMENTS

| | | | | |
|---|---|---|---|---|
| 5,444,404 | A * | 8/1995 | Ebzery | 327/185 |
| 7,278,074 | B2 | 10/2007 | Mitra et al. | |
| 7,661,047 | B2 * | 2/2010 | Rickert et al. | 714/726 |
| 7,793,180 | B1 * | 9/2010 | Shrivastava | 714/726 |
| 7,840,864 | B2 * | 11/2010 | Grise et al. | 714/726 |
| 8,866,528 | B2 | 10/2014 | Lin et al. | |
| 2002/0140480 | A1 * | 10/2002 | Lu et al. | 327/218 |
| 2003/0214318 | A1 * | 11/2003 | Zounes | 326/16 |

(Continued)

OTHER PUBLICATIONS

Non-Final Office Action from U.S. Appl. No. 13/668,110, dated Apr. 3, 2014.

(Continued)

*Primary Examiner* — Albert Decady
*Assistant Examiner* — Osman Alshack
(74) *Attorney, Agent, or Firm* — Zilka-Kotab, PC

(57) ABSTRACT

A scan flip-flop circuit comprises a scan input sub-circuit and a selection sub-circuit. The scan input sub-circuit is configured to receive a scan input signal and a scan enable signal and, when the scan enable signal is activated, generate complementary scan input signals representing the scan input signal that are delayed relative to a transition of a clock input signal between two different logic levels. The selection sub-circuit is coupled to the scan input sub-circuit and configured to receive the complementary scan input signals and, based on the scan enable signal, output an inverted version of either the scan input signal or a data signal as a first selected input signal.

17 Claims, 12 Drawing Sheets

(56) References Cited

U.S. PATENT DOCUMENTS

| | | |
|---|---|---|
| 2007/0226565 A1* | 9/2007 | Kudo ............................. 714/731 |
| 2007/0262787 A1 | 11/2007 | Chakraborty et al. |
| 2008/0284480 A1* | 11/2008 | Ahmadi ........................ 327/210 |
| 2009/0189663 A1* | 7/2009 | Machida ........................ 327/199 |
| 2012/0249194 A1 | 10/2012 | Motabar |
| 2013/0241617 A1 | 9/2013 | Kim |
| 2014/0028362 A1* | 1/2014 | Koike et al. ................... 327/202 |
| 2014/0125377 A1 | 5/2014 | Lin et al. |

OTHER PUBLICATIONS

Notice of Allowance from U.S. Appl. No. 13/668,110, dated Aug. 12, 2014.

* cited by examiner

FLIP-FLOP CIRCUIT HAVING A REDUCED HOLD TIME REQUIREMENT FOR A SCAN INPUT

FIELD OF THE INVENTION

The present invention relates to flip-flop circuits,

BACKGROUND

Within an integrated circuit, a clock signal is distributed to clocked circuits, e.g., flip-flops, configured as pipeline registers and other storage resources. The clock signal is typically distributed to the clocked circuits through a clock tree that includes multiple buffers configured to limit the fanout of each buffer and ensure that the timing characteristics of the clock signal are maintained within a predetermined range so that the integrated circuit operates properly. The number of buffers in the clock tree increases as the load presented to the clock signal by the clocked circuits increases. The amount of power consumed by the clock tree increases as the size of the clock tree increases. Increased power consumption is particularly undesirable, particularly for integrated circuits used in portable devices because the time between recharging the battery is reduced.

There is thus a need for managing the load presented to the clock signal by the clocked circuits within an integrated circuit and/or addressing other issues associated with the prior art.

SUMMARY

A scan flip-flop circuit comprises a scan input sub-circuit and a selection sub-circuit. The scan input sub-circuit is configured to receive a scan input signal and a scan enable signal and, when the scan enable signal is activated, generate complementary scan input signals representing the scan input signal that are delayed relative to a transition of a clock input signal between two different logic levels. The selection sub-circuit is coupled to the scan input sub-circuit and configured to receive the complementary scan input signals and, based on the scan enable signal, output an inverted version of either the scan input signal or a data signal as a first selected input signal.

DETAILED DESCRIPTION

Figure 1A:
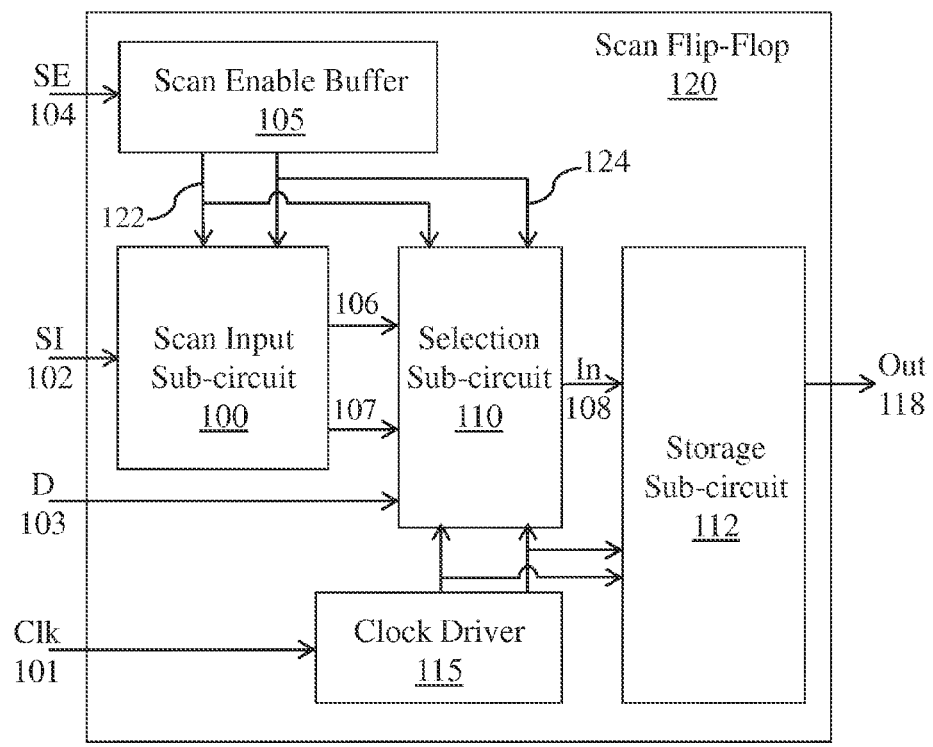
FIG. 1A illustrates a block diagram of a scan flip-flop, in accordance with one embodiment.

FIG. 1A illustrates a block diagram of a scan flip-flop 120, in accordance with one embodiment. The scan flip-flop 120 includes a scan enable buffer 105, a scan input sub-circuit 100, a selection sub-circuit 110, a storage sub-circuit 112, and a clock driver 115. The scan flip-flop 120 receives a scan enable (SE) 104, a scan input (SI) 102, a data bit (D) 103, and a clock (Clk) 101 as input signals. The scan flip-flop 120 generates an output signal, out 118. The SE 104 is activated, e.g., asserted, to configure the scan flip-flop 120 in a test mode. When the SE 104 is not activated, e.g., negated, the scan flip-flop 120 is configured to operate as a flip-flop. The scan enable buffer 105 generates an inverted scan enable signal 122 and a scan enable signal 124 that are both output to the scan input sub-circuit 100 and the selection sub-circuit 110.

The scan input sub-circuit 100 generates complementary scan input signals 106 and 107. When the SE 104 and SI 102 signals are asserted, the first complementary scan input signal 107 is negated and the second complementary input signal 106 is isolated (floats, i.e., is undriven). When the SE 104 signal is asserted and the SI 102 signal is negated, the second complementary input signal 106 is asserted and the first complementary scan input signal 107 is isolated. In other words, when the SE 104 signal is asserted, one of the complementary scan input signals 106 or 107 is driven to the complement (or inverse) of the SI 102 signal.

The selection sub-circuit 110 receives the complementary scan input signals 106 and 107, inverted scan enable, buffered scan enable, D 103, and an inverted clock signal and buffered clock signal generated by the clock driver 115. During normal (non-test mode) operation, the selection sub-circuit 110 is configured to sample the D 103 input signal when the Clk 101 transitions between logic levels, i.e., at either a rising edge or a falling edge. During normal operation, the selection sub-circuit 110 outputs an inverted version of the D 103 input signal when the Clk 101 transitions between two logic levels.

During test mode operation, when the Clk 101 transitions between logic levels, the selection sub-circuit 110 is configured to sample the complementary scan input signal 106 or 107 that is driven. During test mode operation, the selection sub-circuit 110 outputs an inverted version of the SI 102 input when the Clk 101 transitions between two logic levels. The sampled signal is output by the selection sub-circuit 110 as the selected input, in 108. The storage sub-circuit 112 stores the in 108 and transfers the in 108 to the out 118 when the Clk 101 transitions between logic levels. The value transferred to the out 118 is held for one cycle of the Clk 101.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 1B:
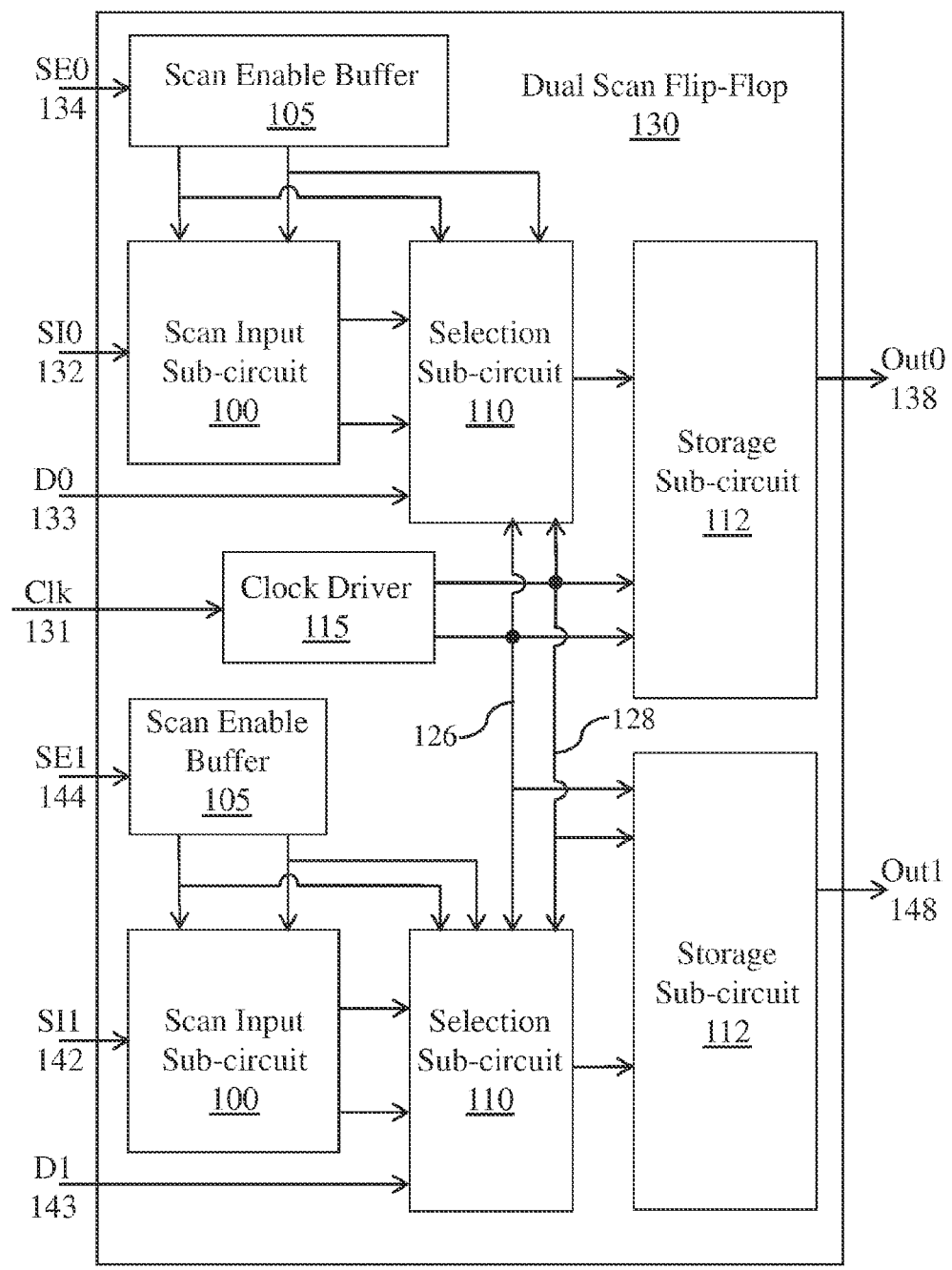
FIG. 1B illustrates a block diagram of a dual scan flip-flop with a shared clock driver, in accordance with one embodiment.

When the scan flip-flop 120 is instantiated within an integrated circuit, the clock driver 115 within the scan flip-flop 120 receives the Clk 101 from a clock tree that generates multiple versions of the clock signal that are each input to one or more scan flip-flops 120. To reduce the load presented to each of the multiple clock signals, the clock driver 115 may be shared between one or more scan flip-flops 120. FIG. 1B illustrates a block diagram of a dual scan flip-flop 130 with a shared clock driver 115, in accordance with one embodiment.

When the clock driver 115 is shared as shown in the scan flip-flop 130, the clock driver 115 will drive twice the load compared with a circuit that includes a clock driver 115 within each flip-flop. However, the load presented to the clock signal generated by the clock tree at Clk 131 is halved per bit of output data. Therefore, in one embodiment, the number of clock signals generated by the clock tree may be reduced based on the reduced load. A reduction in the clock tree reduces power consumption and die area. For one embodiment of an integrated circuit, sharing the clock driver 115 as shown in dual scan flip-flop 130 for most, if not all, scan flip-flops may reduce the power consumption of the integrated circuit by approximately 5%.

The dual scan flip-flop 130 includes two scan enable buffers 105, two scan input sub-circuits 100, two selection sub-circuits 110, and two storage sub-circuits 112. The dual scan flip-flop 130 receives the single clock signal Clk 131 at the single clock driver 115. The dual scan flip-flop 130 also receives two scan enable signals (SE0 134 and SE1 144), two scan input signals (SI0 132 and SI1 142), two data input signals (D0 133 and D1 143), and generates two output signals (Out0 138 and Out1 148).

Figure 1C:
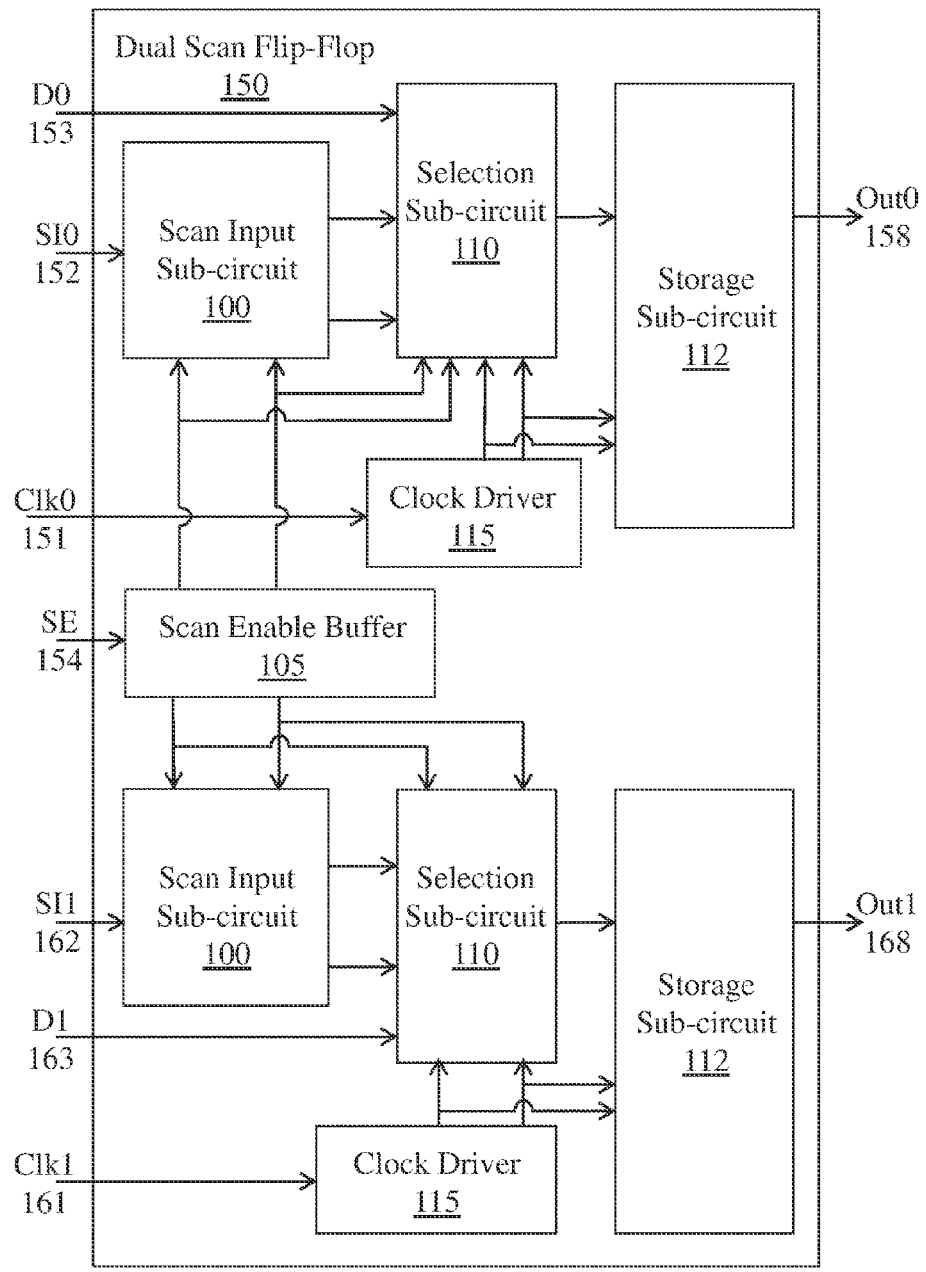
FIG. 1C illustrates a block diagram of a dual scan flip-flop with a shared scan enable buffer, in accordance with one embodiment.

Similar to the clock tree that generates multiple clock signals, multiple scan enable signals are also generated and distributed to dual scan flip-flops 120 and/or 130. The scan enable buffer 105 may be shared between two or more scan flip-flops to reduce the power consumption resulting from generating multiple scan enable signals. Sharing the scan enabled buffer 105 between two or more scan flip-flops also reduces the area of the scan flip-flops. FIG. 1C illustrates a block diagram of a dual scan flip-flop 150 with a shared scan enable buffer 105, in accordance with one embodiment.

The dual scan flip-flop 150 includes two clock drivers 115, two scan input sub-circuits 100, two selection sub-circuits 110, and two storage sub-circuits 112. The dual scan flip-flop 130 receives the single scan enable signal SE 154 at the single scan enable buffer 105. The dual scan flip-flop 150 also receives two Clk signals (Clk0 151 and Clk1 161), two scan input signals (SI0 152 and SI1 162), two data input signals (D0 153 and D1 163), and generates two output signals (Out0 158 and Out1 168).

Figure 1D:
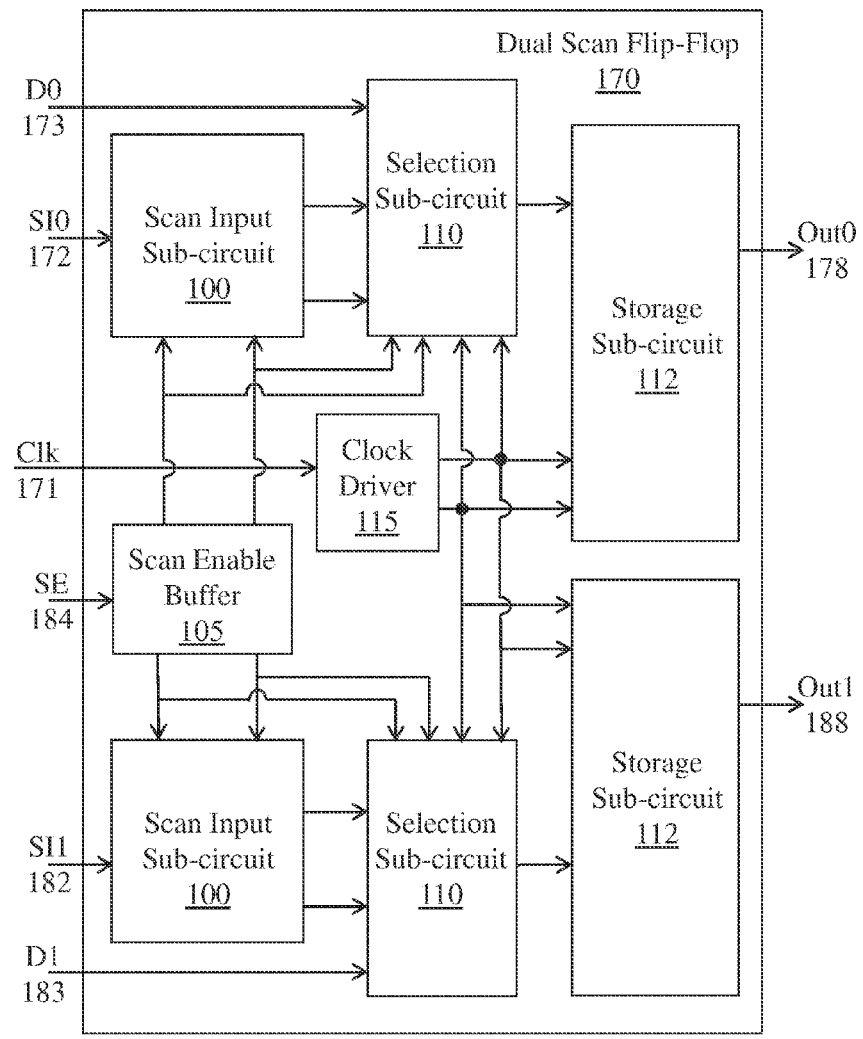
FIG. 1D illustrates a block diagram of a dual scan flip-flop with a shared clock driver and a shared scan enable buffer, in accordance with one embodiment.

Finally, the scan enable buffer 105 and the clock driver 115 may be shared between two or more scan flip-flops. Sharing the scan enabled buffer 105 and the clock driver 115 between two or more scan flip-flops reduces the power consumption and the area of the scan flip-flops. FIG. 1D illustrates a block diagram of a dual scan flip-flop 170 with a shared dock driver 115 and a shared scan enable buffer 105, in accordance with one embodiment.

The dual scan flip-flop 170 includes two scan input sub-circuits 100, two selection sub-circuits 110, and two storage sub-circuits 112. The dual scan flip-flop 170 receives the single scan enable signal SE 184 at the single scan enable buffer 105 and receives the single Clk 171 at the single clock driver 115. The dual scan flip-flop 170 also receives two scan input signals (SI0 172 and SI1 182) and two data input signals (D0 173 and D1 183), and generates two output signals (Out0 178 and Out1 188).

Although the dual scan flip-flops 130, 150, and 170 each perform the operations of two scan flip-flops, one or more of the dual scan flip-flops 130, 150, and 170 may include additional sub-circuits to perform the operations of more than two scan flip-flops. The number of scan flip-flops that may share a single clock driver 115 is limited by the desired characteristics of the inverted dock signal and the buffered dock signal that are generated by the clock driver 115. Similarly, the number of scan flip-flops that may share a single scan enable buffer 105 is limited by the desired characteristics of the scan enable signal (SE 144, 154, and 184) and the inverted scan enable signal that are generated by the scan enable buffer 105.

Figure 2:
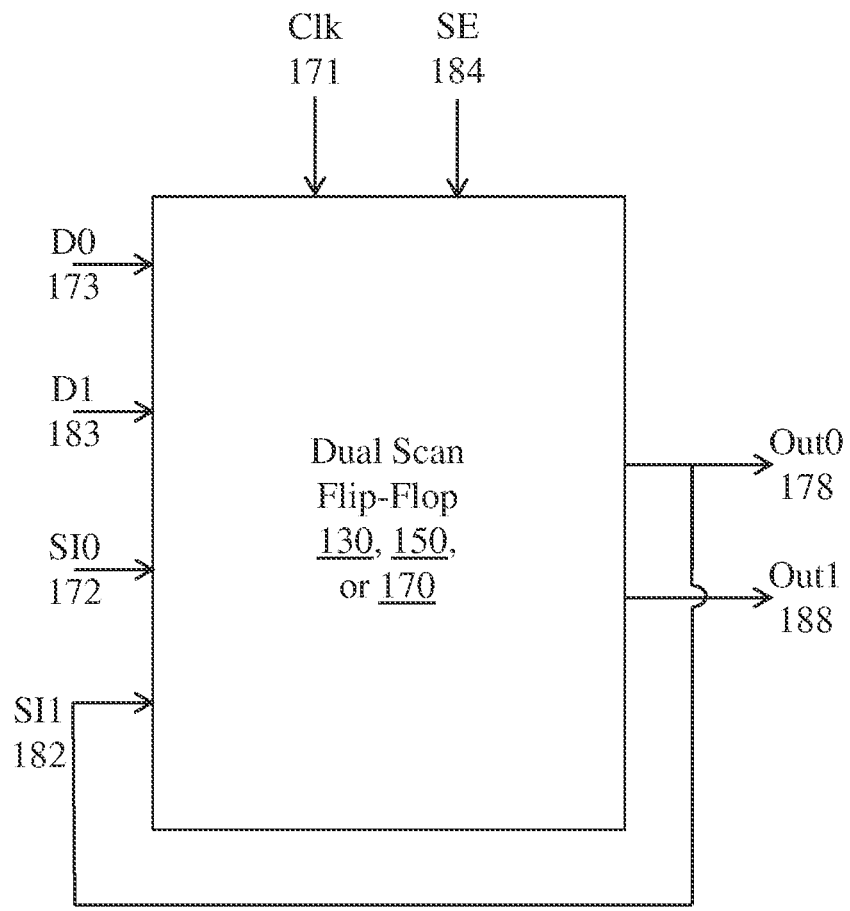
FIG. 2 illustrates a dual scan flip-flop configured as part of a scan chain, in accordance with one embodiment.

FIG. 2 illustrates a dual scan flip-flop 170 configured as part of a scan chain, in accordance with one embodiment. The dual scan flip-flops 130 and/or 150 may be also be configured as part of the scan chain or as part of a different scan chain. Because the clock driver 115 is shared within the dual scan flip-flop, the inverted clock signal 126 and the buffered clock signal 128 that are each generated by the clock driver 115 is delayed or slower compared with a dual scan flip-flop including two or more clock drivers 115. In other words, because the load on the output signals generated by the clock driver 115 is increased when the clock driver 115 is shared, the output signals are slower (assuming that the drive strength of the clock driver 115 is not increased by modifying the circuitry within the dock driver 115). In contrast, the input signals SI0 172, D0 173, SI1 182, and D1 183 are not delayed or slowed as a result of sharing the clock driver 115. Consequently, the hold time requirement for the input signals relative to the clock 171 may be increased, requiring the input signals to be held longer following a sampling (rising or falling) edge of the clock 171.

Typically, combinatorial logic is coupled to the D0 173 and D1 183 inputs because the dual scan flip-flop 170 is used as a pipeline register, and, as a result the hold time requirements relative to the clock 171 are met. However, the SI0 172 and SI1 182 inputs are typically coupled directly to one of the output signals, out0 178 or out1 188, so the hold time requirements may not be met for the SI0 172 and SI1 182 inputs relative to the dock 171. For example, as shown in FIG. 2, the data output signal of a first flip-flop within the dual scan flip-flop 170, e.g., out0 178, is coupled to the second scan input signal of a second flip-flop within the dual scan flip-flop 170, e.g., SI1 182. Any hold time violations, including hold time violations that are introduced at SI1 182 when the clock driver 115 is shared, may be fixed by inserting delay circuitry between the out0 178 and the SI1 182.

The insertion of the delay circuitry to fix hold time violations is accomplished after the scan flip-flops 170 are placed and routed within the layout of an integrated circuit. In general, it is desirable to avoid fixing hold time violations because the delay circuitry increases the die area and may also increase power consumption. An alternative to fixing hold time violations by inserting delay circuitry following the place and route during the design of an integrated circuit is to design the scan input sub-circuit 100 included within the scan flip-flops 130, 150, and 170 to slow the SI inputs relative to the sampling edge of the clk signal. Techniques for doing this are shown in FIGS. 3A, 4, 5, 6, and 7, as described further herein.

Returning to FIG. 2, when the scan enable buffer 105 is shared, the scan enable SE 184 and inverted scan enable signals may be delayed due to the increase load. However, delaying the SE 184 signal will cause any hold time requirement of the SE 184 signal relative to the Clk 171 to be more likely to be met. Additionally, the scan enable signal SE 184 is not typically toggling every clock cycle. Instead, the SE 184 is typically activated (i.e., asserted) for many clock cycles as test vectors are scanned into the scan flip-flops 170 during a test mode. The SE 184 is also typically activated for many clock cycles as the test results are scanned out of the scan flip-flops 170. Otherwise, when the integrated circuit is not operating in a test mode, the SE 184 is not activated (i.e., negated).

Figure 3A:
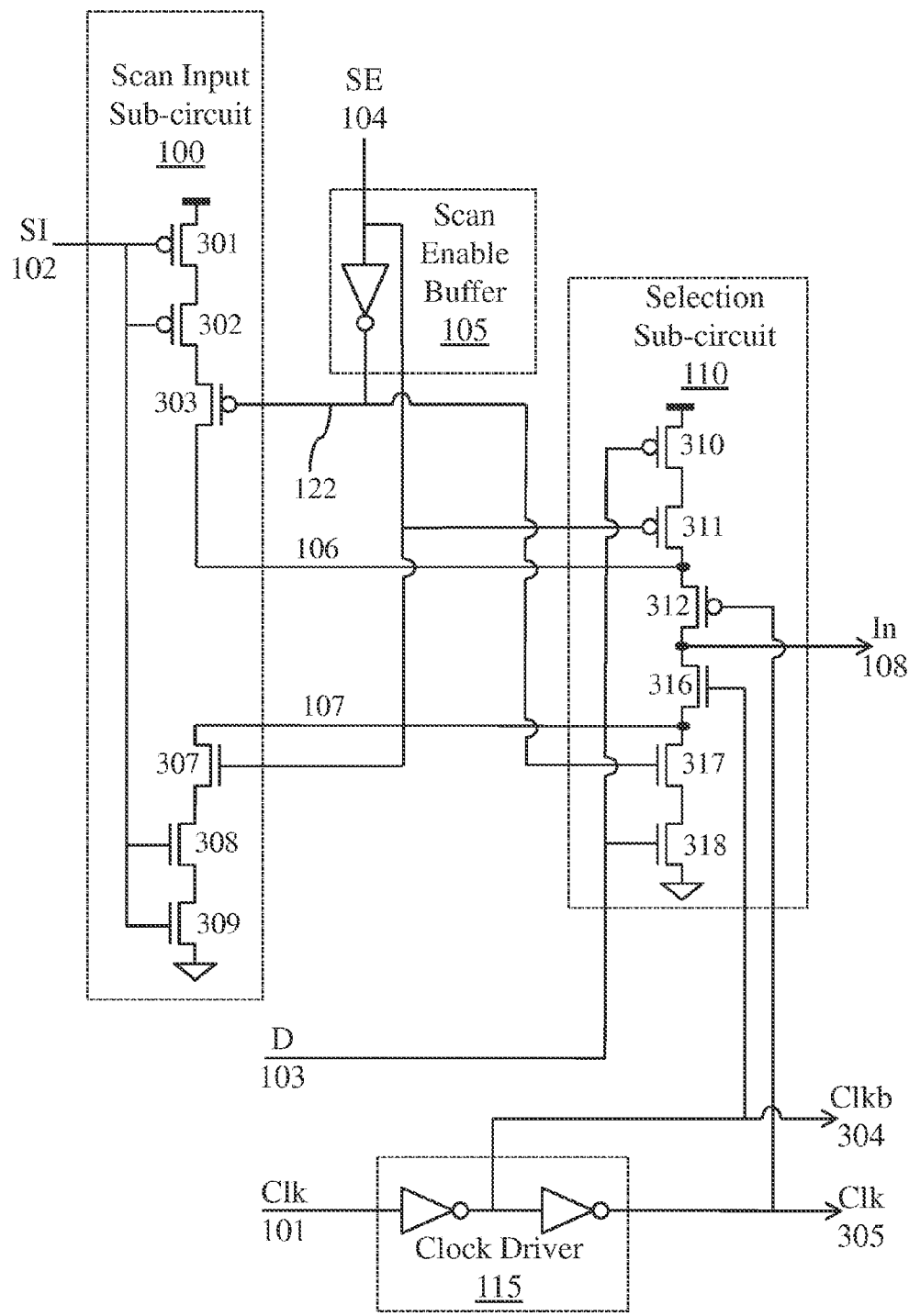
FIG. 3A illustrates a detailed block diagram of the scan flip-flop shown in FIG. 1A, in accordance with one embodiment.

FIG. 3A illustrates a detailed block diagram of the scan flip-flop 130 shown in FIG. 1A, in accordance with one embodiment. While a particular circuit is provided herein as an example of the scan flip-flop 130, it should be strongly noted that such circuit is set forth for illustrative purposes only, and any scan flip-flop circuit may be employed to supplement and/or substitute for the same.

The scan input sub-circuit 100 includes PMOS (P metal-oxide semiconductor) transistors 301 and 302 that are configured as a first stack sub-circuit. The transistors 301 and 302 are coupled in series with a third PMOS transistor 303 that is enabled when SE 104 is activated. The gates of transistors 301 and 302 are both coupled to the SI 102 input signal. When the SI 102 signal is negated, transistors 301 and 302 are enabled so that when SE 104 is activated, the first signal 106 of the complementary scan input signals is pulled to a high logic level, e.g., the VDD power supply. Only one of transistors 301 and 302 is needed to pull the signal 106 to the high logic level. The second transistor in the first stack sub-circuit provides an additional load at the SI 102 signal. The drive strength of the scan input sub-circuit 100 is reduced and the signal 106 is delayed. Because the signal 106 is delayed, the hold time requirement for SI 102 relative to the elk 101 is more likely to be met when the Clkb 304 and/or Clk 305 signals are delayed. As previously explained, the inverted clock signal, Clkb 304 and the buffered clock signal 305 generated by the clock driver 115 are delayed when the clock driver 115 is shared between two or more flip-flops. However, the Clkb 304 and/or Clk 305 signals may be delayed for other reasons that also cause the hold time requirement for one or more input signals to increase.

The scan input sub-circuit 100 includes NMOS (N metal-oxide semiconductor) transistors 308 and 309 that are configured as a second stack sub-circuit. The transistors 308 and 309 are coupled in series with a third NMOS transistor 307 that is enabled when SE 104 is activated. The gates of transistors 308 and 309 are both coupled to the SI 102 input signal. When the SI 102 signal is asserted, transistors 308 and 309 are enabled so that when SE 104 is activated, the second signal 107 of the complementary scan input signals is pulled to a low logic level, e.g., the VSS power supply. Only one of transistors 308 and 309 is needed to pull the signal 107 to the low logic level. The second transistor in the second stack sub-circuit provides an additional load at the SI 102 signal. The drive strength of the scan input sub-circuit 100 is reduced and the signal 106 is delayed. Because the signal 106 is delayed, the hold time requirement for SI 102 relative to the clk 101 is more likely to be met when the Clkb 304 and/or Clk 305 signals are delayed.

The selection sub-circuit 110 receives the complementary scan input signals 106 and 107, the SE 104, an inverted scan enable signal 122, and the D 103 input signal. The selection sub-circuit 110 also receives the Clkb 304 and the Clk 305.

The PMOS transistors 310, 311, and 312 are coupled in series with the NMOS transistors 316, 317, and 318 that are also coupled in series. When the Clk 101 is negated, either D 103 or SI 102 is passed through to generate the In 108 output signal. When the SE 104 signal is activated, one of the complementary scan input signals 106 and 107 drives the SI 102 signal through transistors 312 and 316 to the In 108 output signal when Clk 101 is negated. When the SE 104 is negated the complementary scan input signals are not driven (e.g., the signals float) and the D 103 drives the In 108 output signal when Clk 101 is negated. When the Clk 101 is asserted the In 108 output is isolated from the D 103, SE 104, and SI 102 input signals.

Figure 3B:
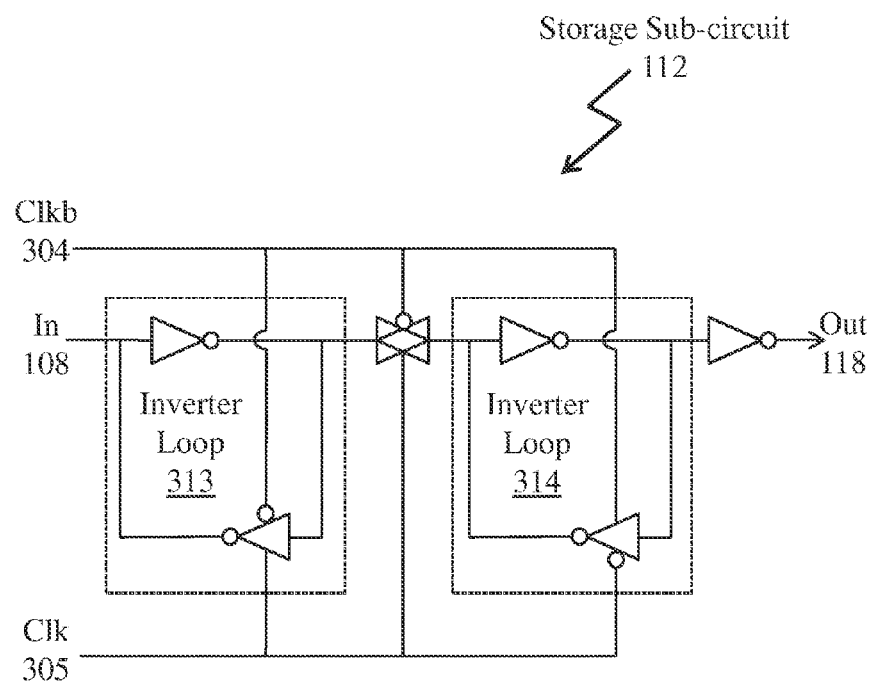
FIG. 3B illustrates a detailed block diagram of the storage sub-circuit shown in FIG. 3A, in accordance with one embodiment.

FIG. 3B illustrates a detailed block diagram of the storage sub-circuit 112 shown in FIG. 3A, in accordance with one embodiment. While a particular storage sub-circuit is provided herein as an example of the storage sub-circuit 112, it should be strongly noted that such circuit is set forth for illustrative purposes only, and any storage sub-circuit may be employed to supplement and/or substitute for the same.

The storage sub-circuit 112 receives the in 108 signal, the Clkb 304, and the Clk 305. When the Clk 305 is asserted and the Clkb 304 is negated, the in 108 signal is maintained by the first inverter loop 313. When the Clk 305 is asserted and the Clkb 304 is negated the in 108 signal is transferred to the out 118 output signal. When the Clk 305 is negated and the Clkb 304 is asserted, the out 118 signal is maintained by the second inverter loop 314.

Figure 4:
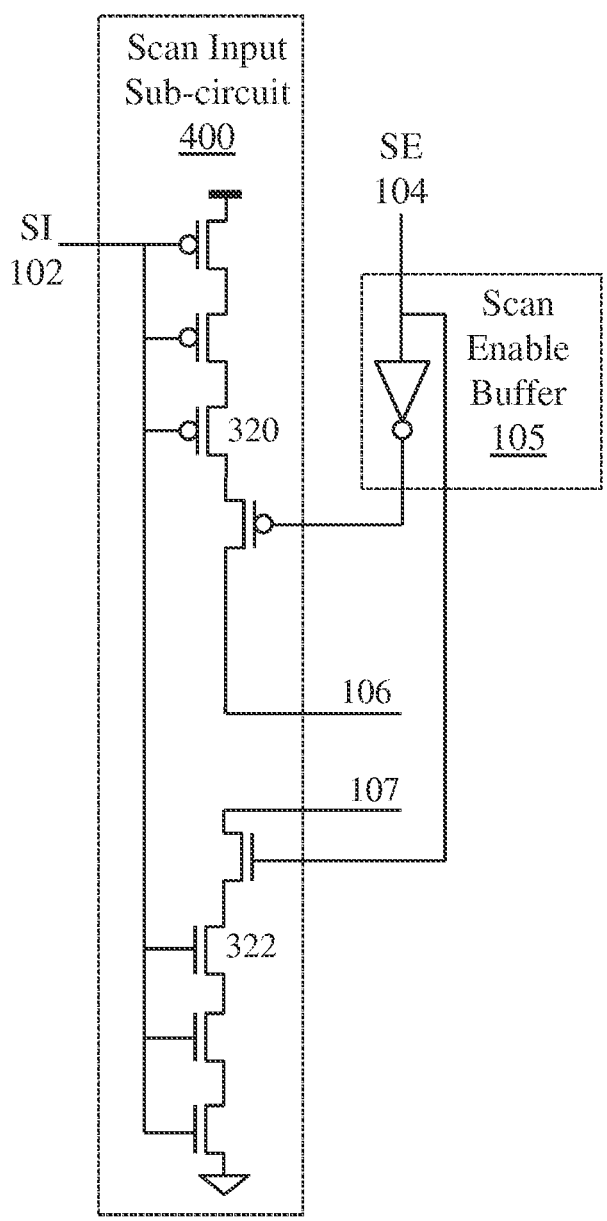
FIG. 4 illustrates a detailed block diagram of the scan input sub-circuit and the scan enable buffer shown in FIG. 3A, in accordance with one embodiment.

FIG. 4 illustrates a detailed block diagram of the scan input sub-circuit 400 and the scan enable buffer 105 shown in FIG. 3A, in accordance with one embodiment. The scan input sub-circuit 400 may be used in place of the scan input sub-circuit 100. To further reduce the drive strength of the scan input sub-circuit 400, an additional PMOS transistor 320 is coupled in series with the first stack sub-circuit and an additional NMOS transistor 322 is coupled in series with the second stack sub-circuit.

The additional PMOS and NMOS transistors 320 and 322 in the first and second stack sub-circuits provide additional loading at the SI 102 signal. The drive strength of the scan input sub-circuit 400 is reduced and the complementary scan input signals 106 and 107 are delayed. Because the complementary scan input signals 106 and 107 are delayed, the hold time requirement for SI 102 relative to the clk 101 is more likely to be met when the Clkb 304 and/or Clk 305 signals are delayed.

Figure 5:
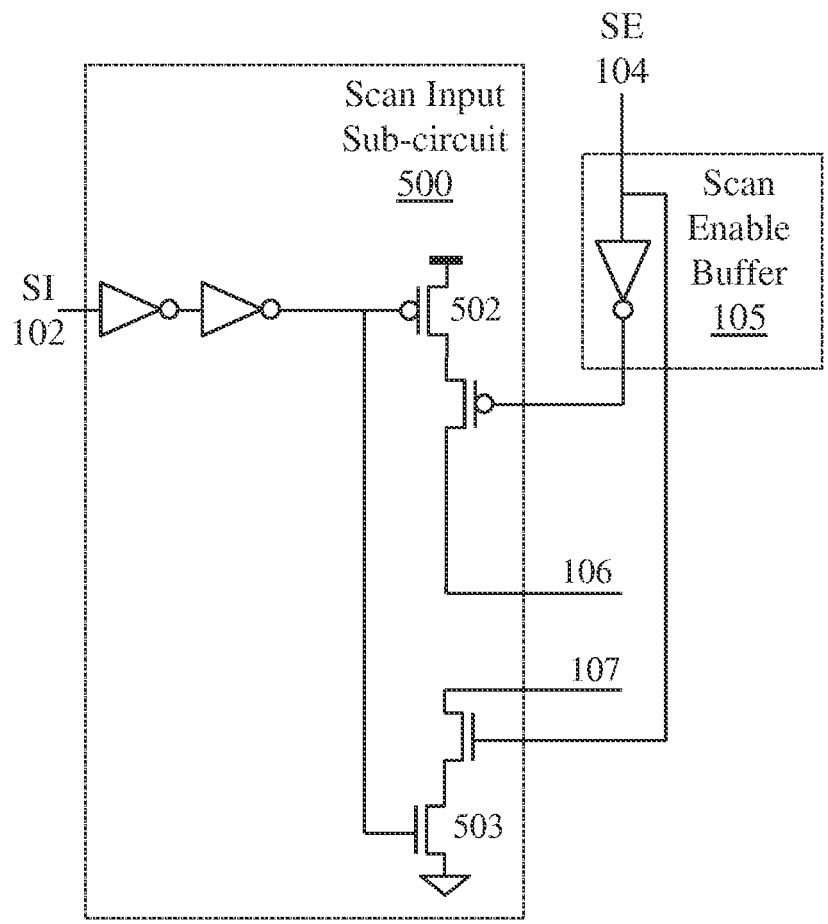
FIG. 5 illustrates a detailed block diagram of the scan input sub-circuit and the scan enable buffer shown in FIG. 3A, in accordance with another embodiment.

FIG. 5 illustrates a detailed block diagram of the scan input sub-circuit 500 and the scan enable buffer 105 shown in FIG. 3A, in accordance with another embodiment. The scan input sub-circuit 500 may be used in place of the scan input sub-circuit 100. The first and second input stack sub-circuits are each reduced to a single transistor, PMOS transistor 502 and NMOS transistor 503, having a gate coupled to a buffered version of the SI 102 signal. The buffered version of the SI 102 is generated by two inverters coupled in series and is delayed relative to the SI 102 signal. Therefore, the complementary scan input signals 106 and 107 are delayed, and the hold time requirement for SI 102 relative to the elk 101 is more likely to be met when the Clkb 304 and/or Clk 305 signals are delayed.

Figure 6:
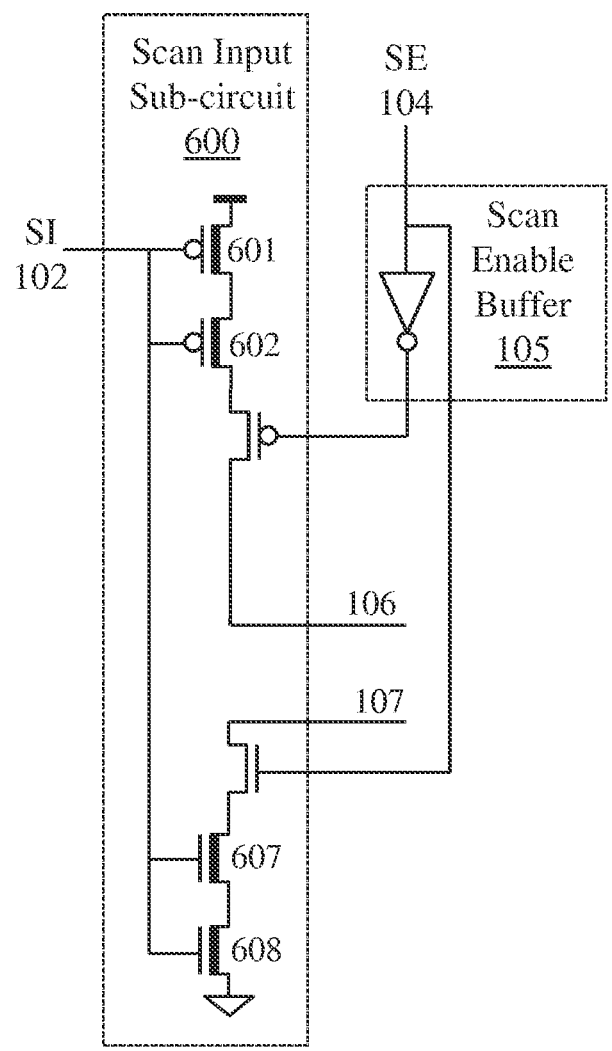
FIG. 6 illustrates a detailed block diagram of the scan input sub-circuit and the scan enable buffer shown in FIG. 3A, in accordance with yet another embodiment.

FIG. 6 illustrates a detailed block diagram of the scan input sub-circuit 600 and the scan enable buffer 105 shown in FIG. 3A, in accordance with yet another embodiment. The scan input sub-circuit 600 may be used in place of the scan input sub-circuit 100. The scan input sub-circuit 600 includes transistors configured in the same topology as the transistors shown in the scan input sub-circuit 100 shown in FIG. 3A.

The transistors 601 and 602 have increased channel lengths compared with the transistors 301 and 302 of FIG. 3A. Similarly, the transistors 607 and 608 have increased channel lengths compared with the transistors 308 and 309 of FIG. 3A. The increased channel lengths reduce the drive strength of the transistors 601, 602, 607, and 608. The increased channel lengths may also increase the threshold voltages of the transistors 601, 602, 607, and 608. Therefore, the complementary scan input signals 106 and 107 are delayed, and the hold time requirement for SI 102 relative to the Clk 101 is more likely to be met when the Clkb 304 and/or Clk 305 signals are delayed.

Figure 7:
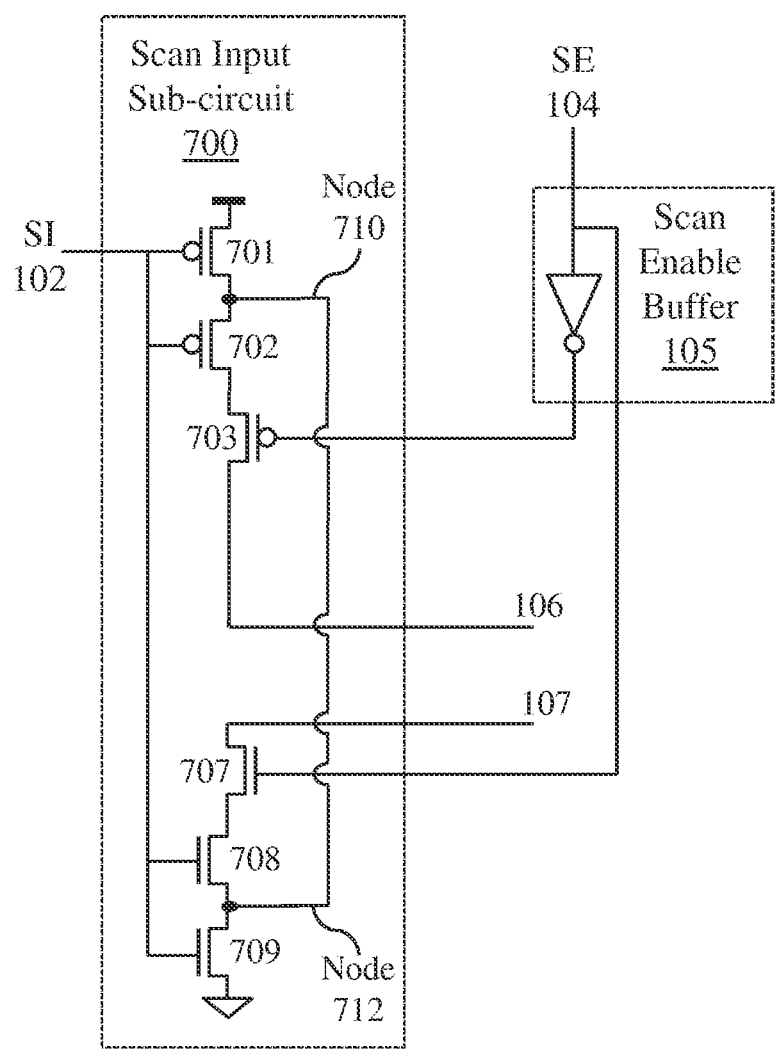
FIG. 7 illustrates a detailed block diagram of the scan input sub-circuit and the scan enable buffer shown in FIG. 3A, in accordance with still another embodiment.

FIG. 7 illustrates a detailed block diagram of the scan input sub-circuit 700 and the scan enable buffer 105 shown in FIG. 3A, in accordance with still another embodiment. The scan input sub-circuit 700 may be used in place of the scan input sub-circuit 100. The scan input sub-circuit 700 includes PMOS transistors 701 and 702 that are configured as a first stack sub-circuit. The transistors 701 and 702 are coupled in series with a third PMOS transistor 703 that is enabled when SE 104 is activated. The gates of transistors 701 and 702 are both coupled to the SI 102 input signal. When the SI 102 signal is negated, transistors 701 and 702 are enabled so that when SE 104 is activated, the first signal 106 of the complementary scan input signals is pulled to a high logic level, e.g., the VDD power supply.

The transistors 708 and 709 are configured as a second stack sub-circuit. The transistors 708 and 709 are coupled in series with a third NMOS transistor 707 that is enabled when SE 104 is activated. The gates of transistors 708 and 709 are both coupled to the SI 102 input signal. When the SI 102 signal is asserted, transistors 708 and 709 are enabled so that when SE 104 is activated, the second signal 107 of the complementary scan input signals is pulled to a low logic level, e.g., the VSS power supply.

The second transistor (702 and 708) in the first and the second stack sub-circuits provides additional loads at the SI 102 signal. The drive strength of the scan input sub-circuit 100 is reduced and the complementary scan input signals 106 and 107 are delayed. Because the signals 106 and 107 are delayed, the hold time requirement for SI 102 relative to the Clk 101 is more likely to be met when the Clkb 304 and/or Clk 305 signals are delayed.

The switching capacitance at nodes 710 and 712 is increased because an additional connection is added coupling the transistors 701 and 702 to transistors 708 and 709 between nodes 710 and 712. In one embodiment, the connection is routed in metal that is coupled to the transistors 701, 702, 708, and 709 through vias that contribute additional capacitive loads at the nodes 710 and 712. The increased switching capacitance at the nodes 710 and 712 delays the complementary scan input signals 106 and 107. Because the signals 106 and 107 are delayed, the hold time requirement for SI 102 relative to the Clk 101 is more likely to be met when the Clkb 304 and/or Clk 305 signals are delayed.

The additional connection that couples the 701, 702, 707, and 708 at nodes 710 and 712 does not change the function performed by the scan input sub-circuit or the selection sub-circuit 110 because the nodes 710 and 712 are isolated from the complementary scan input signals 106 and 107 when the SE 104 signal is negated. The connection that couples the transistors 701, 702, 707, and 708 at the node 710 may increase the area of the scan input sub-circuit 700 compared with the scan input sub-circuit 100. However, compared with adding additional transistors, the increase in area is small and is smaller than inserting delay circuitry to fix hold time violations following place and route.

Figure 8:
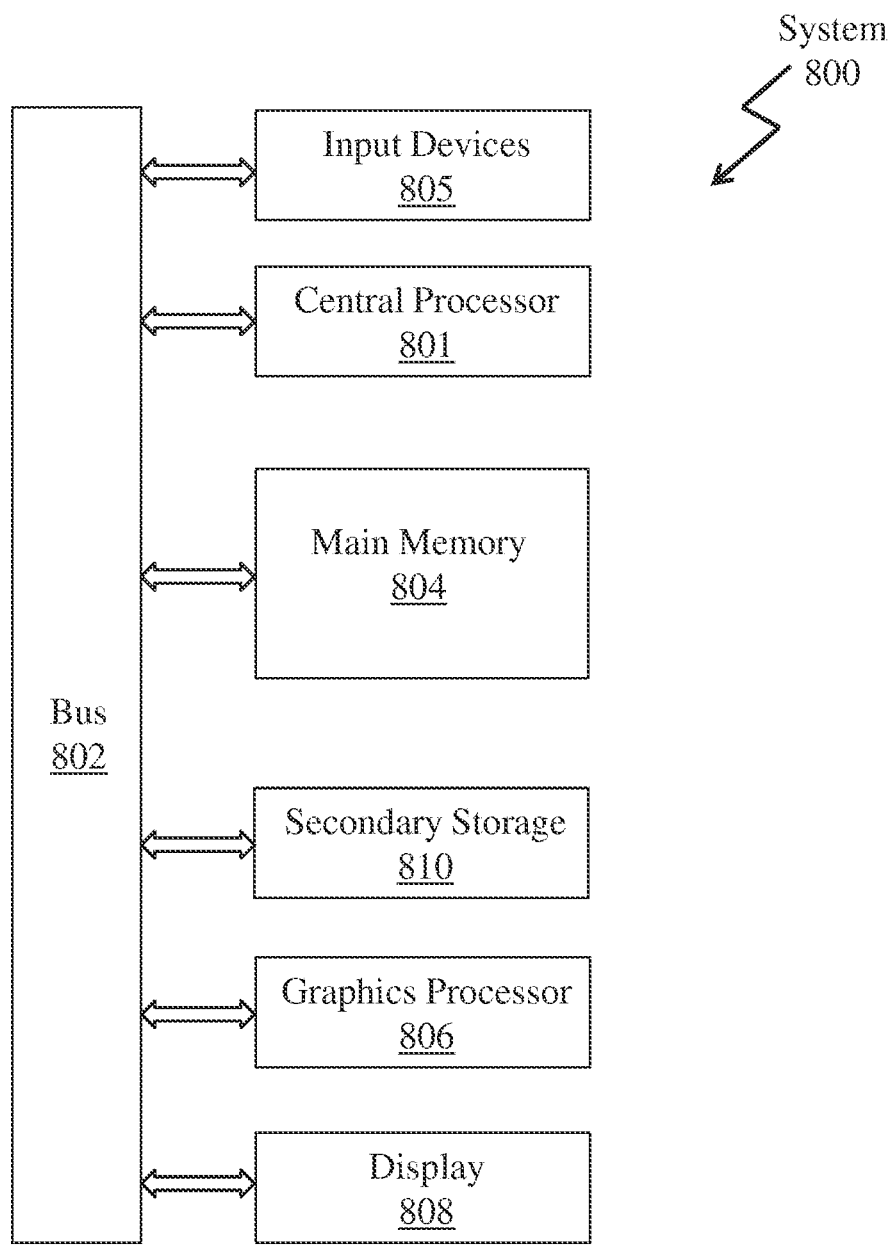
FIG. 8 illustrates an exemplary system in which the various architecture and/or functionality of the various previous embodiments may be implemented.

FIG. 8 illustrates an exemplary system 800 in which the various architecture and/or functionality of the various previous embodiments may be implemented. As shown, a system 800 (use bold) is provided including at least one central processor 801 that is connected to a communication bus 802. The communication bus may be implemented using any suitable protocol, such as PCI (Peripheral Component Interconnect), PCI-Express, AGP (Accelerated Graphics Port), HyperTransport, or any other bus or point-to-point communication protocol(s). The system 800 also includes a main memory 804. Control logic (software) and data are stored in the main memory 804 which may take the form of random access memory (RAM). In particular, one or more of the circuits shown in FIG. 8 may include one or more of the dual scan flip-flop 130, 150, and 170 and the scan flip-flop 120.

The system 800 also includes input devices 805, a graphics processor 806, and a display 808, i.e. a conventional CRT (cathode ray tube), LCD (liquid crystal display), LED (light emitting diode), plasma display or the like. User input may be received from the input devices 805, e.g., keyboard, mouse, touchpad, microphone, and the like. In one embodiment, the graphics processor 806 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 800 may also include a secondary storage 810. The secondary storage 810 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 804 and/or the secondary storage 810. Such computer programs, when executed, enable the system 800 to perform various functions. Memory 804, storage 810 and/or any other storage are possible examples of computer-readable media.

In one embodiment, the architecture and/or functionality of the various previous figures may be implemented in the context of the central processor 801, graphics processor 806, an integrated circuit (not shown) that is capable of at least a portion of the capabilities of both the central processor 801 and the graphics processor 806, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 800 may take the form of a desktop computer, laptop computer, server, workstation, game consoles, embedded system, and/or any other type of logic. Still yet, the system 800 may take the form of various other devices including, but not limited to a personal digital assistant (PDA) device, a mobile phone device, a television, etc.

Further, while not shown, the system 800 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A scan flip-flop circuit, comprising:
    a scan input sub-circuit configured to:
        receive a scan input signal and a scan enable signal; and
        when the scan enable signal is activated, generate complementary scan input signals representing the scan input signal that are delayed relative to a transition of a clock input signal between two different logic levels,
        wherein the scan input sub-circuit comprises a first stack sub-circuit comprising a first transistor coupled in series with a second transistor, a gate of the first transistor and a gate of the second transistor are coupled to the scan input signal, and the first stack sub-circuit is configured to pull a first signal of the complementary scan input signals to a high logic level when the scan enable signal is asserted and the scan input signal is negated; and
    a selection sub-circuit that is coupled to the scan input sub-circuit and configured to:
        receive the complementary scan input signals; and
        based on the scan enable signal, output an inverted version of either the scan input signal or a data signal as a selected input signal.

2. The scan flip-flop circuit of claim 1, further comprising a storage sub-circuit configured to store the selected input signal and transfer the selected input signal to an output signal when a buffered clock signal transitions between the two different logic levels.

3. The scan flip-flop circuit of claim 2, further comprising a clock driver configured to receive the clock input signal, generate an inverted clock signal, and generate a buffered clock signal.

4. The scan flip-flop circuit of claim 3, wherein the clock driver is coupled to a second scan flip-flop circuit that is configured to receive the inverted clock signal and the buffered clock signal, the second scan flip-flop circuit comprising a second storage sub-circuit configured to store a second selected input signal and transfer the second selected input signal to a second output signal when the buffered clock signal transitions between the two different logic levels.

5. The scan flip-flop circuit of claim 1, wherein the first stack sub-circuit further comprises a third transistor coupled in series with the first transistor and the second transistor, and a gate of the third transistor is coupled to the scan input signal.

6. The scan flip-flop circuit of claim 1, wherein the scan input sub-circuit further comprises a second stack sub-circuit comprising a third transistor coupled in series with a fourth transistor, wherein a gate of the third transistor and a gate of the fourth transistor are coupled to the scan input signal, wherein the second stack sub-circuit is configured to pull a second signal of the complementary scan input signals to a low logic level when the scan enable signal is asserted and the scan input signal is asserted.

7. The scan flip-flop circuit of claim 6, wherein the second stack sub-circuit further comprises a fifth transistor coupled in series with the third and the fourth transistor, and a gate of the fifth transistor is coupled to the scan input signal.

8. The scan flip-flop circuit of claim 6, wherein a first node between the first transistor and the second transistor is coupled to a second node between the third transistor and the fourth transistor.

9. The scan flip-flop circuit of claim 8, wherein a connection between the first node and the second node is routed in a metal layer through a first via coupled to the first node and a second via coupled to the second node.

10. The scan flip-flop circuit of claim 5, wherein a channel length of the first transistor and the second transistor is greater than a channel length of the third transistor.

11. The scan flip-flop circuit of claim 1, further comprising a scan enable buffer configured to receive the scan enable signal and generate an inverted scan enable signal.

12. The scan flip-flop circuit of claim 11, wherein the scan enable buffer is coupled to a second flip-flop circuit that is configured to receive the scan enable signal and the inverted scan enable signal, the second flip-flop circuit comprising a second scan input sub-circuit.

13. A scan flip-flop circuit, comprising:
    a scan input sub-circuit configured to:
        receive a scan input signal and a scan enable signal; and
        when the scan enable signal is activated, generate complementary scan input signals representing the scan input signal that are delayed relative to a transition of a clock input signal between two different logic levels,
        wherein the scan input sub-circuit comprises:
            a first inverter that receives the scan input signal and generates an inverted scan input signal;
            a second inverter that receives the inverted scan input signal and generates a delayed scan input signal; and
            a first transistor having a gate configured to receive the delayed scan input signal, the first transistor is configured to pull a first signal of the complementary scan input signals to a high logic level when the scan enable signal is asserted and the scan input signal is negated; and
    a selection sub-circuit that is coupled to the scan input sub-circuit and configured to:
        receive the complementary scan input signals; and
        based on the scan enable signal, output an inverted version of either the scan input signal or a data signal as a selected input signal.

14. The scan flip-flop circuit of claim 13, wherein the scan input sub-circuit further comprises:
    a second transistor having a gate configured to receive the delayed scan input signal, wherein the first transistor is configured to pull a second signal of the complementary scan input signals to a low logic level when the scan enable signal is asserted and the scan input signal is asserted.

15. A system comprising:
    a scan flip-flop circuit, comprising:
        a scan input sub-circuit configured to:
            receive a scan input signal and a scan enable signal; and
            when the scan enable signal is activated, generate complementary scan input signals representing the scan input signal that are delayed relative to a transition of a clock input signal between two different logic levels, wherein the scan input sub-circuit comprises a first stack sub-circuit comprising a first transistor coupled in series with a second transistor, a gate of the first transistor and a gate of the second transistor are coupled to the scan input signal, and the first stack sub-circuit is configured to pull a first signal of the complementary scan input signals to a high logic level when the scan enable signal is asserted and the scan input signal is negated; and a selection sub-circuit that is coupled to the scan input sub-circuit and configured to:

receive the complementary scan input signals; and based on the scan enable signal, output an inverted version of either the scan input signal or a data signal as a first selected input signal.

16. The system of claim 15, wherein the scan input sub-circuit further comprises a second stack sub-circuit comprising a third transistor coupled in series with a fourth transistor, wherein a gate of the third transistor and a gate of the fourth transistor are coupled to the scan input signal, wherein the second stack sub-circuit is configured to pull a second signal of the complementary scan input signals to a low logic level when the scan enable signal is asserted and the scan input signal is asserted.

17. The system of claim 16, wherein a first node between the first transistor and the second transistor is coupled to a second node between the third transistor and the fourth transistor.

* * * * *